United States Patent [19]

Hasegawa et al.

[11] Patent Number: 4,931,796
[45] Date of Patent: Jun. 5, 1990

[54] DIGITAL-TO-ANALOG CONVERSION CIRCUIT

[75] Inventors: Yoshinori Hasegawa; Kiyofumi Hirai, both of Saitama, Japan

[73] Assignee: Pioneer Electronic Corporation, Tokyo, Japan

[21] Appl. No.: 271,963

[22] Filed: Nov. 16, 1988

[30] Foreign Application Priority Data

Mar. 3, 1988 [JP] Japan .................................. 63-50420

[51] Int. Cl.$^5$ ............................................ H03M 1/78
[52] U.S. Cl. .................................... 341/154; 341/144; 341/148; 341/150
[58] Field of Search ............... 341/144, 148, 150, 153, 341/154, 132

[56] References Cited

U.S. PATENT DOCUMENTS

| 4,005,406 | 1/1977 | Kaneko et al. ....................... 341/118 |
| 4,030,092 | 6/1977 | Sieber et al. ......................... 341/144 |
| 4,318,085 | 3/1982 | Whiteside et al. ................... 341/154 |
| 4,369,433 | 1/1983 | Yamakido ............................ 341/150 |
| 4,468,607 | 8/1984 | Tanaka et al. ....................... 341/144 |
| 4,544,912 | 10/1985 | Iwamoto et al. . | |
| 4,721,943 | 1/1988 | Stallkamp ............................. 341/144 |

OTHER PUBLICATIONS

Patent Abstracts of Japan, vol. 11, No. 209, JP 62 29320 A E-521, 7/7/87.
Patent Abstracts of Japan, vol. 11, No. 165, JP 61 295722 A E-510, 5/27/87.
Patent Abstracts of Japan, vol. 10, No. 99, JP 60 241330 A E-396, 4/16/86.
German Search Report, Nov. 24, 1988.

Primary Examiner—William M. Shoop, Jr.
Assistant Examiner—Gary J. Romano
Attorney, Agent, or Firm—Sughrue, Mion, Zinn, MacPeak & Seas

[57] ABSTRACT

In a digital-to-analog conversion circuit, a level detector is used to determine when the digital signal is lower than a predetermined value. When a predetermined time has expired, after the level detection, an inversion detector detects an inversion in polarity of the digital signal. As a result, a control signal is produced to shift the digital signal input to the digital-to-analog (D/A) converter and to attenuate the output analog signal.

6 Claims, 3 Drawing Sheets

DIGITAL-TO-ANALOG CONVERSION CIRCUIT

FIELD OF THE INVENTION

The present invention relates to a digital-to-analog conversion circuit, and more particularly to a digital-to-analog conversion circuit for converting an input digital signal of m bits into an analog signal by using a digital-to-analog converter (hereinafter, referred to as a D/A converter) of n-bits (n<m).

BACKGROUND OF THE INVENTION

In the field of digital audio circuits or the like, a digital-to-analog conversion circuit in which an input digital signal of m bits is digital-to-analog converted by using a D/A converter having parallel input terminals of n bits (n<m) makes the circuit inexpensive. FIG. 4 shows an example of such a conventional D/A conversion circuit.

In FIG. 4, parallel data consisting of m bits is passed through input terminals $1_1$-$1_m$. The most significant bit (MSB) representing the polarity of the data is directly applied to an input of a D/A converter 2, the second through n-th bits are applied respectively to a first set of inputs to switches $SW_1$-$SW_{n-1}$ of a selector 3, and the (m−n)-th from the second bit, i.e., the (2+m−n)th bit, through the m-th or least significant bit (LSB) are applied respectively to a second set of inputs to the switches $SW_1$-$SW_{n-1}$. The MSB and the (n−1) bits passed through the selector 3 are converted into analog data in the D/A converter 2 which has n parallel input bit terminals. After being selectively level-controlled by a variable gain amplifier 4, the analog data provided by the D/A converter 2 is output from the amplifier 4 as an analog output. The D/A converter 2 starts D/A conversion in response to a start instruction signal supplied through an input terminal 5.

Several of the most significant bits of the m bits of parallel data, for example, the upper three bits which are not provided as second inputs to switches $SW_1$ through $SW_{n-1}$, are also supplied to a level detector 6. Weighting of the respective parallel data is determined by the code logic of the respective bits. Therefore, if the codes of the upper three bits are encoded by the level detector 6 constituted, for example, by an EX-OR circuit, it is possible to detect the signal level of an input digital signal with respect to a set level determined by the upper three bits of the input digital signal. The level detector 6 generates a detection output when the signal level of the input digital signal is lower than the set level. The detection output triggers a retriggerable monostable multi-vibrator (hereinafter abbreviated as retriggerable MMV) 7. The output of the retriggerable MMV 7 is used as a control signal for switching the contacts of the switches $SW_1$-$SW_{n-1}$ and for changing the gain of the variable gain amplifier 4.

In this arrangement, when the signal level of the input digital signal is higher than the set value, no control signal is generated from the retriggerable MMV 7 so that the switches $SW_1$-$SW_{n-1}$ constituting the selector 3 are maintained in the state as illustrated in the drawing and the gain of the variable gain amplifier 4 is not changed. Accordingly, the n bits consisting of the MSB and the next (n−1) most significant bits are applied to the D/A converter 2 so that the data is converted to an analog output.

When the signal level of the input digital signal is lower than the set value, on the other hand, the respective contacts of the switches $SW_1$-$SW_{n-1}$ of the selector 3 are switched to the lower positions in the drawing in response to the control signal of the retriggerable MMV 7. Thus, the LSB and the next (n−1) least significant bits are all shifted toward the MSB by (m−n) bits, e.g., two bits in the illustrated example, and these n least significant bits are applied to the D/A converter 2 together with the data of the MSB. At the same time, the gain of the variable gain amplifier 4 is changed to a lower value in response to the control signal of the retriggerable MMV 7 and the signal level of the output analog signal is attenuated by a value corresponding to the increase in the digital data value caused by the above-mentioned 2-bit data shift. As a result, the signal level of the output analog signal will correspond to that of the original digital data value. In this case, as shown in FIG. 5, the retriggerable MMV 7 has a predetermined delay time $t_0$, so that the state of the switches $SW_1$-$SW_{n-1}$ and the gain of the variable gain amplifier 4 are changed when no input digital signal having a signal level higher than or equal to the set level exists during the waiting time $t_0$.

SUMMARY OF THE INVENTION

It is an object of the present invention to eliminate the foregoing disadvantage in the prior art, and more particularly to provide a D/A converter in which it is possible to minimize the distortion which will be generated when changing over to a small-signal level mode.

To achieve this and other objects, the D/A converter according to the present invention is arranged so that changeover to the small signal mode is performed at the first zero-crossing after the lapse of a predetermined time from a point in time of detection of reduction of the signal level of the input digital signal to become lower than a predetermined set level.

BRIEF DESCRIPTION OF THE DRAWINGS

An embodiment of the present invention will now be described in detail with reference to the accompanying drawings, in which.

DESCRIPTION OF THE PREFERRED EMBODIMENT

Figure 1:
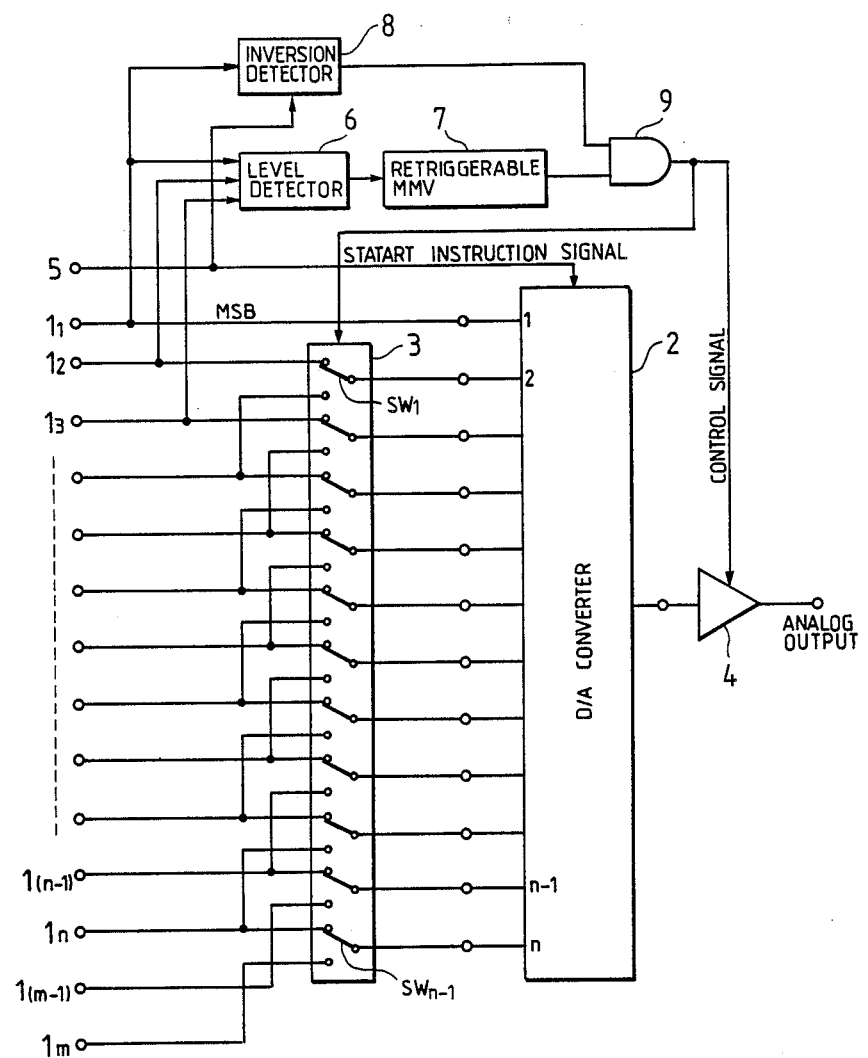
FIG. 1 is a block diagram showing an embodiment of the present invention.
Figure 4:
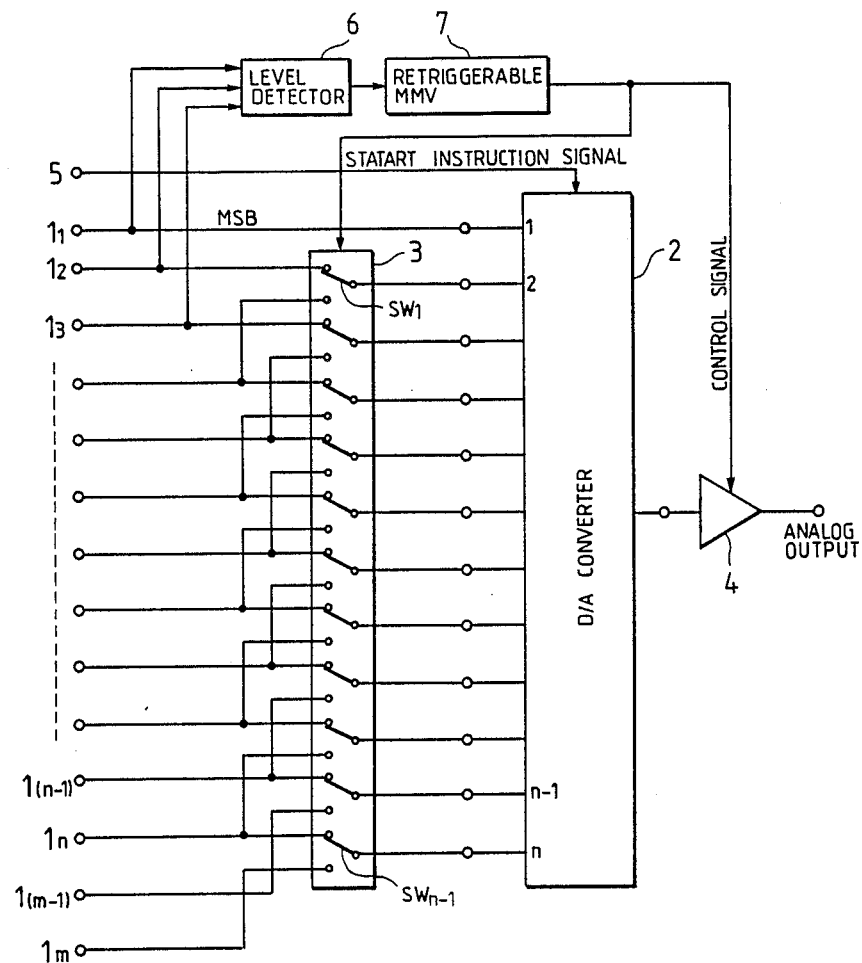
FIG. 4 is a block diagram showing a conventional D/A converter.

FIG. 1 is a block diagram showing an embodiment of the present invention, in which portions equivalent to those in FIG. 4 are correspondingly referenced. As shown in the drawing, the arrangement of this embodiment is the same as that shown in FIG. 4 except for the provision of an inversion detector 8 for detecting the occurrence of inversion in polarity of an analog signal represented by an input digital signal, and an AND circuit 9 having two inputs to which the respective outputs of the inversion detector 8 and the retriggerable MMV 7, and the output signal of the AND circuit 9 is used as a control signal for changing-over the state of the switches $SW_1$-$SW_{n-1}$ of the selector 3 and for changing-over the gain of the variable gain amplifier 4. The explanation regarding the portions which are the same as those in FIG. 4 is therefore omitted.

Figure 2:
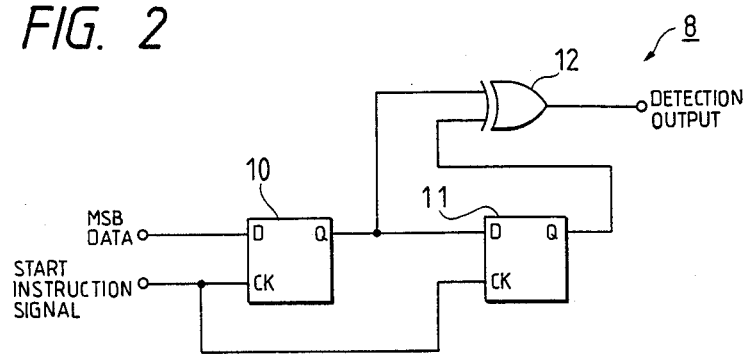
FIG. 2 is a block diagram showing an example of the arrangement of the inversion detector of FIG. 1.

The polarity inversion detector 8 is constituted as shown in FIG. 2. A D-type flip-flop (hereinafter abbreviated as D-FF) 10 has a data (D) input which is supplied with the data at the MSB of the input digital signal and a clock (CK) input which is supplied with a D/A conversion start instruction signal. A D-FF 11 has a D input which is supplied with a Q output of the D-FF 10 and a CK input which is supplied with the above-mentioned D/A conversion start instruction signal. An EX-OR circuit 12 has two inputs which are supplied with the outputs of the D-FFs 10 and 11 respectively.

In this arrangement, assuming that the input digital signal is coded with, for example, a 2's complement code, the MSB of the input digital signal indicates the polarity of the input digital signal. Assuming that the D/A conversion is started at the trailing edge of the D/A conversion start instruction signal, the polarity inversion detector 8 compares the data of the MSB at the trailing edge (i.e., at the output of FF-10) with the preceding MSB data (i.e., at the output of FF-11). A disagreement between the two data means that a polarity inversion has occurred, and that the polarity inversion detector 8 produces a detection signal having, for example, a high level.

Figure 3:
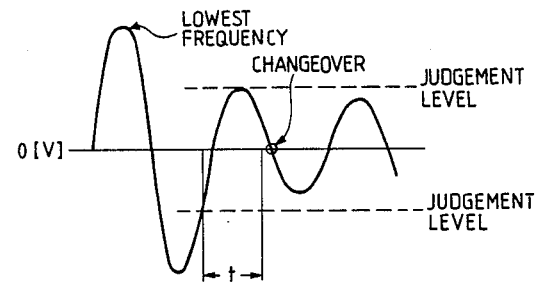
FIG. 3 illustrates a waveform for explaining the operation of the circuit of FIG. 1.
Figure 5:
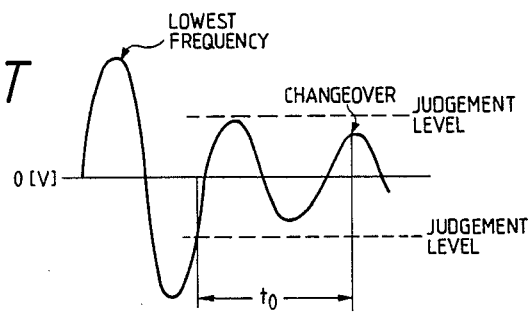
FIG. 5 illustrates a waveform for explaining the operation of the circuit of FIG. 4.

There is a minimum time t required by the retriggerable MMV 7 for changing-over the mode of the digital data into a small-signal level mode, as shown in FIG. 3. The output of the retriggerable MMV 7 is made high when the signal level of the input digital signal remains lower than the judgment level (the set level) for a duration equal to the interval t, while the output of the retriggerable MMV 7 is made low when the signal level becomes equal to or higher than the judgment level.

The outputs of the polarity inversion detector 8 and the retriggerable MMV 7 are applied respectively to the two inputs of AND gate 9. The output of AND gate 9 is used as the control signal for changing-over the state of the switches $SW_1$-$SW_{n-1}$ and for changing-over the gain of the variable gain amplifier 4. With this arrangement, the change-over from a large-signal level mode to a small-signal level mode is performed when the signal level of a D/A conversion output is approximately equal to 0(V) after the lapse of the necessary minimum time t.

When the lowest frequency to be recorded on a disk is, for example, 4 Hz in a reproduction processing system of a compact disk player or the like, the necessary minimum time t is set so that a sinusoidal wave of 4 Hz can be reproduced with no distortion. That is, since there will be two opportunities for changeover in every period of the frequency of 4 Hz, it will be sufficient to select the necessary minimum time t, which is the waiting time for change-over into the small-signal mode, to be a value not smaller than $t=1/(4\times 2)$.

Although the aforementioned embodiment shows the case where the input digital signal, the selector 3 and the D/A converter 2 are of the parallel type, they may be of the serial type so that the inversion detection using the MSB is realized, for example, after serial-to-parallel conversion. Further, although the embodiment shows the case where the signal level control of the output analog signal is performed by using the variable gain amplifier 4, a mere attenuator such as a resistor or the like may be used because the essential purpose of the variable gain amplifier 4 is to perform attenuation.

As described above, in the digital-to-analog converter according to the present invention, the change-over from the large-signal level mode to the small-signal level mode is performed at a point in time when the inversion of the polarity of an original analog signal of an input digital signal is detected after the lapse of a predetermined time from a point in time of detection of reduction of the signal level of the input digital signal to become lower than a predetermined set level, so that the signal level of the output analog signal is equal to a value in the vicinity of 0(V) at the point in time of the change-over to thereby make it possible to suppress the change-over distortion in the output analog signal.

What is claimed is:

1. A digital-to-analog conversion circuit comprising level detection means for detecting when a signal level of an input digital signal of m bits is lower than a predetermined set value, digital-to-analog (D/A) conversion means of n bits (n being smaller than m), means responsive to a predetermined control signal for shifting said input digital signal in the direction of the most significant bit (MSB) by a predetermined number of bits and to supply the shifted digital signal to said digital-to-analog conversion means, and means responsive to said predetermined control signal for attenuating the signal level of an output analog signal of said digital-to-analog conversion means by a value corresponding to said predetermined number of bits, the improvement comprising:
   inversion detection means for detecting an inversion in polarity of said input digital signal; and
   means for producing said predetermined control signal at a first polarity inversion detected by said inversion detection means after the lapse of a predetermined time from a point in time of a detection by said level detection means.

2. A method of converting a digital signal to an analog signal, comprising:
   detecting when a signal level of said digital signal is lower than a predetermined signal level;
   detecting an inversion in polarity of said digital signal a predetermined time after said level detection; and
   if an inversion in polarity has occurred and the digital signal level has remained lower than the predetermined signal level, producing a control signal to shift bits of the digital signal before they are input to a digital-to-analog converter and to attenuate a signal level of an output of the digital-to-analog converter.

3. A digital-to-analog (D/A) conversion circuit for converting a digital input signal to an analog output signal in accordance with a conversion characteristic, said conversion circuit including changeover means for switching from a first conversion characteristic to a second conversion characteristic, said conversion circuit further comprising means for permitting said switching from said first conversion characteristic to said second characteristic only in the vicinity of a zero-crossing in said analog output signal.

4. A D/A conversion circuit according to claim 3, wherein said changeover means comprises a variable gain amplifier.

5. A D/A conversion circuit according to claim 3, wherein said changeover means comprises means for shifting bits of said input signal.

6. A D/A conversion circuit according to claim 3, wherein said changeover means is responsive to a control signal, said conversion circuit including first means for generating a first signal in accordance with a property of said digital input signal, second means for generating a second signal representing a zero-crossing of said analog output signal, and third means responsive to both of said first and second signals for generating said control signal.

* * * * *